United States Patent [19]

Savant

[11] Patent Number: 4,993,955

[45] Date of Patent: Feb. 19, 1991

[54] TOP-LOAD SOCKET FOR INTEGRATED CIRCUIT DEVICE

[75] Inventor: John A. Savant, Austin, Tex.

[73] Assignee: Minnesota Mining and Manufacturing Company, St. Paul, Minn.

[21] Appl. No.: 490,458

[22] Filed: Mar. 8, 1990

[51] Int. Cl.⁵ .............................................. H05K 1/00
[52] U.S. Cl. ..................................... 439/73; 439/331
[58] Field of Search .................... 439/68, 72, 73, 266, 439/267, 525, 152, 153, 159, 160, 330, 331

[56] References Cited

U.S. PATENT DOCUMENTS

| | | | |
|---|---|---|---|
| 4,402,563 | 9/1983 | Sinclair | 439/73 |
| 4,407,555 | 10/1983 | Lockard | 439/73 |
| 4,491,377 | 1/1985 | Pfaff | 339/74 R |
| 4,623,208 | 11/1986 | Kerul et al. | 339/74 R |
| 4,630,875 | 12/1986 | Korsunsky et al. | 339/17 CF |
| 4,678,255 | 7/1987 | Carter | 439/267 |
| 4,715,823 | 12/1987 | Exura et al. | 439/267 |
| 4,789,345 | 12/1988 | Carter | 439/266 |
| 4,832,610 | 5/1989 | Matsuoka | 439/68 |
| 4,846,703 | 7/1989 | Matsuoka et al. | 439/71 |
| 4,846,704 | 7/1989 | Ikeya | 439/72 |
| 4,872,850 | 10/1989 | Mogi | 439/266 |
| 4,886,470 | 12/1989 | Billman et al. | 439/266 |

Primary Examiner—David L. Pirlot
Assistant Examiner—Julie R. Daulton
Attorney, Agent, or Firm—Donald M. Sell; Walter N. Kirn; John C. Barnes

[57] ABSTRACT

A socket assembly for top-loading IC devices having a cam member, actuated by a vertically moving guide member, positioned for engaging the contact elements and retracting the contacting portions thereof to allow insertion or removal of the IC device in relationship to the socket assembly.

16 Claims, 4 Drawing Sheets

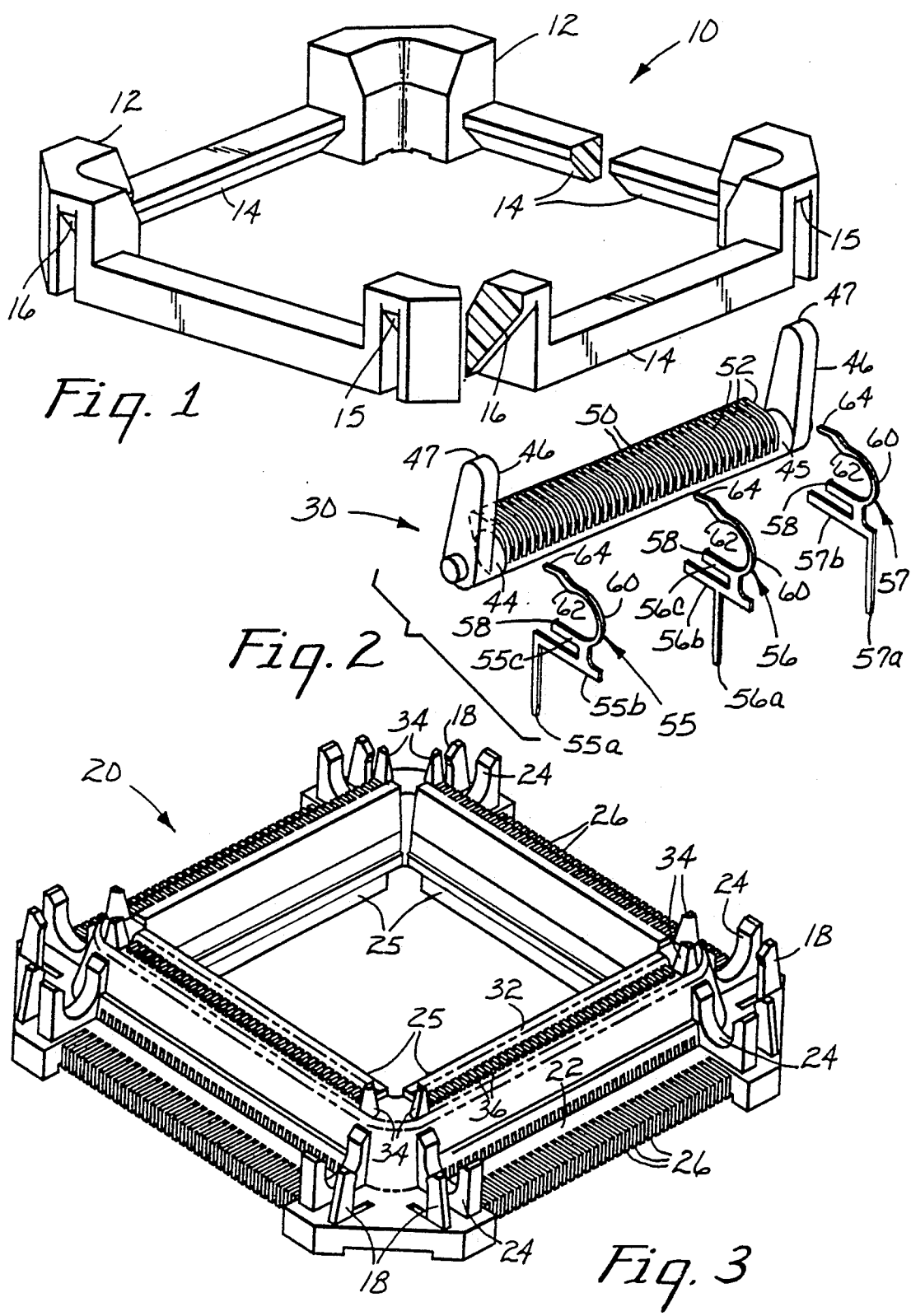

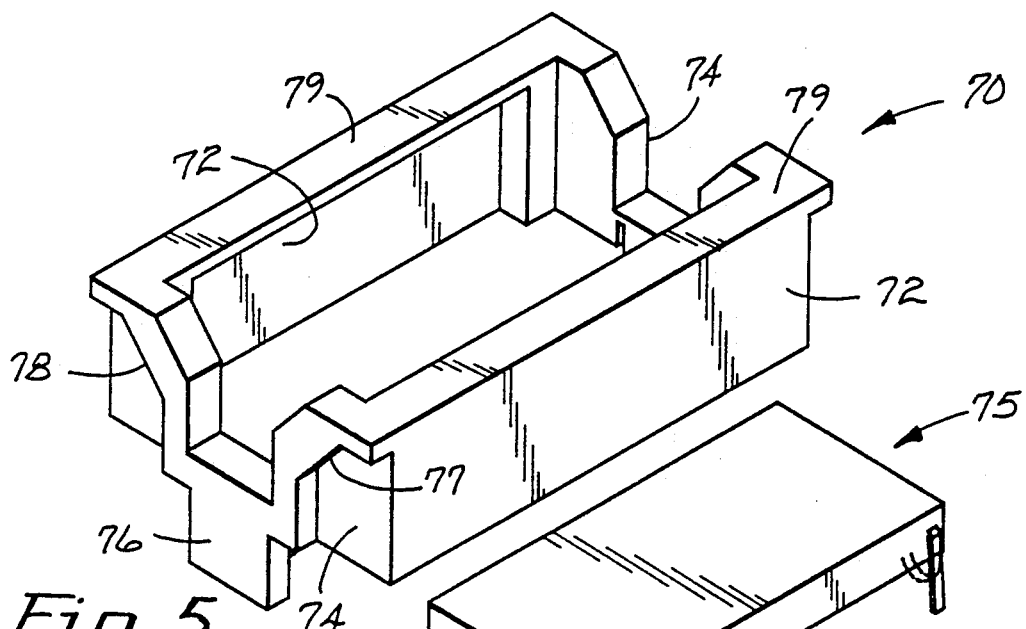
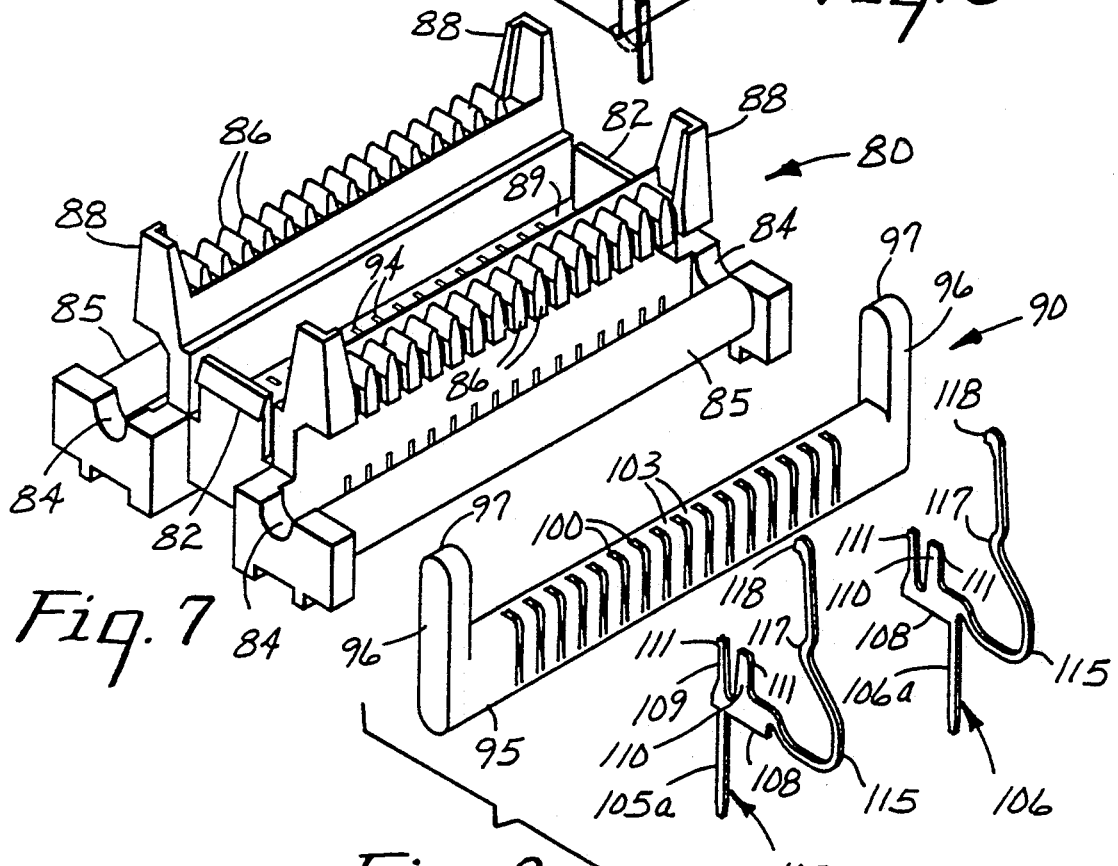

TOP-LOAD SOCKET FOR INTEGRATED CIRCUIT DEVICE

BACKGROUND OF THE INVENTION

1. Field of the Invention

The present invention relates to an improved socket assembly for use with an integrated circuit device or package (IC), having a socket which opens with force applied on the top edges of the socket to allow insertion or removal of the IC, and in one aspect to a socket for IC's having an improved positive contact opening structure.

2. Description of the Prior Art

Top loading sockets for integrated circuit devices or packages (IC's) are known and are used to connect IC's to printed circuit boards for test or burn-in by automated operations, or for the functional application affording the replacement of the IC without subjecting other components on a printed circuit board or the like to heat, to afford the removal or replacement of the IC. To this end there have been sockets designed to afford the top-loading of the IC, whether the IC is leaded or leadless.

Examples of the sockets or carriers of the prior art include U.S. Pat. No. 4,491,377 directed to a carrier for a leadless chip and comprising a base portion, a support housing, a plurality of position contact pins and a spreader. The same are secured together by a plurality of studs. The spreader moves with respect to the remainder of the structure. Downward movement of the spreader, which has an inwardly and downwardly projecting lip which engages an edge of each pin to act as a camming surface against the edges of the pins, causes a bending of the pins to urge them outwardly from a central cavity defined by the contact pins to allow insertion of the leadless chip carrier into the cavity to a position to rest on the top surface of the intermediate support. Release of the downward pressure on the spreader will relax the contact pins, and they will engage the edges of the leadless chip carrier. This position of the contact pins places them in physical and electrical contact with the chip carrier and locks the chip carrier in the housing. This structure has a lip which engages the upper inwardly diverging edge of each contact pin and does not restrict the possible displacement of the free standing end of one or more of the contact pins. Each contact pin has an inclined surface which engages a substantial surface of the inwardly and downwardly inclined lip of the spreader, increasing the force to deflect the pins to the open position for receiving the chip carrier.

U.S. Pat. No. 4,846,704 disclosed a test socket having a main body supporting a plurality of flat plate-like contacts which face an installation recess. The contacts are fixed to the base in a fashion such that each lead leg may be extended downward and has an elastic curved part which is bent somewhat outward above the fixed part. At the upper end of the curved part is a contact part which is pressed against the IC chip by the elasticity of the curved part. A trigger part of the contact is positioned between the socket body and a cover and can be compressed downwardly by the lower edge of the cover to retract the contact part. This movement permits an IC chip to be inserted into a recess space defined by rows of the contacts. As above, the cover engages each contact trigger part to effect an elastic or resilient transformation of the curved part to retract the contact part and to release it against the lead of the chip.

Sockets of a similar design are found in U.S. Pat. Nos. 4,623,208; 4,715,823 and 4,846,703. These IC socket assemblies have contacts formed with a pressure receiving portion used to pull the contact portion away from the IC receiving cavity when a top or housing is moved vertically with respect to the base supporting the contacts. Again stability of the contact portion of each contact, together with positive flexure of the contact to retract the contact portion, is lacking in the structures disclosed, and contact between the top or housing with each contact is required.

Further, the structure of the sockets with a pressure receiving portion projecting from the contacts causes them to increase the profile or area the socket structure requires on the printed circuit board.

The socket assembly of the present invention affords positive movement of the contacting portion of the contact.

The contacts have a profile which affords a substantial reduction in the dimensions and area of the socket structure, and therefore the area required on the printed circuit board.

The retraction device to retract the contacting portion of the contacts restricts displacement of the contacting portion and assures positive movement of the contacting portion.

The socket assembly is of a design which reduces the number of dimensionally critical features on each part.

SUMMARY OF THE INVENTION

The socket assembly of the present invention is adapted for use with an integrated circuit device having a plurality of leads arranged along at least one side of the device. The assembly comprises a support frame having a generally rectangular configuration. The support frame is provided with spacers along at least one side for receiving a plurality of contact elements. The contact elements are generally planar and are disposed in spaced parallel relationship along the side or sides of the frame, and each contact element comprises a terminal for connecting the contact element with an external electronic member, an anchor for anchoring the contact element to the support frame, a contacting portion for making resilient pressure contact with a lead or the contact point of an integrated circuit device, and a resilient portion affording the movement of said contacting means from a first normal unflexed position to an open position for receiving an integrated circuit device and to an operative position in pressure electrical contact with a lead on the device. An oscillational cam member is positioned along the side of said support frame, or along two sides or along each side, and is supported by the support frame for engaging said contact elements to urge the contacting portion thereof from said normal position to the open position. The cam member is operative upon movement of a top plate or guide member supported above the support frame, which guide member is mounted for sliding movement in relationship to said support frame from a first position to a second position, affording movement of the cam surface of said cam member for moving the contact elements to an open position upon movement of said guide member toward the support frame and to release the contact elements upon movement thereof in a direction away from the support frame.

BRIEF DESCRIPTION OF THE DRAWINGS

The present invention will be described in detail with reference to the accompanying drawing wherein:

FIG. 1 is a perspective view of the top plate or guide member of the socket assembly of the present invention, partially broken away for purposes of illustration;

FIG. 2 is a perspective-exploded view of one cam member and a plurality of contact elements of the socket assembly;

FIG. 3 is a perspective view of the support frame of the socket assembly;

FIG. 5 is a perspective view of a top plate or guide member of a second embodiment of the present invention;

FIG. 6 is a perspective-schematic view of an IC device, showing only a few of the leads for purposes of simplicity and in broken lines alternative shapes for the leads;

FIG. 7 is a perspective view of the support frame of the second embodiment of the socket assembly;

FIG. 8 is a perspective-exploded view of one cam member and a plurality of contacts of the second embodiment.

DESCRIPTION OF THE PREFERRED EMBODIMENT

Figure 4:
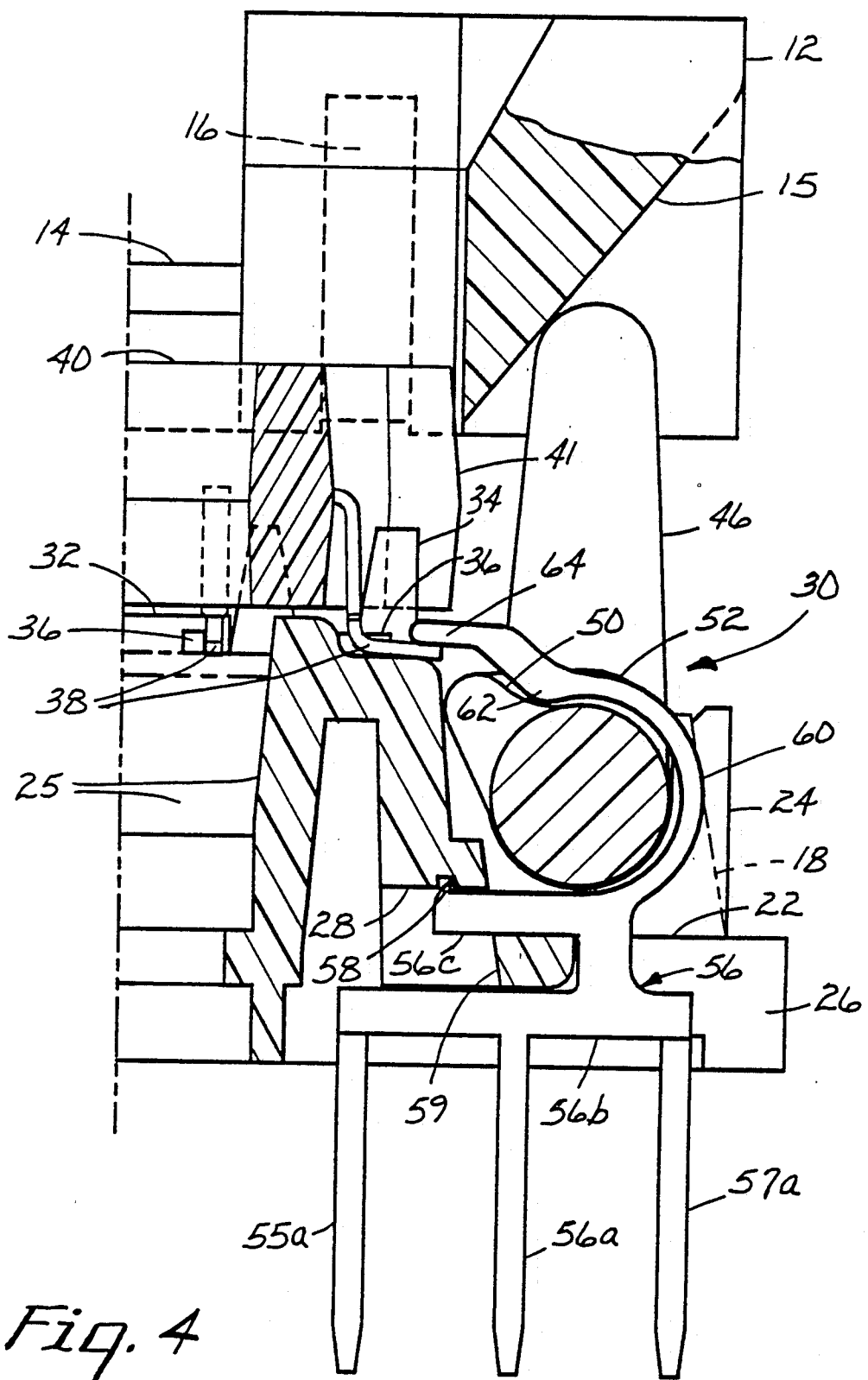
FIG. 4 is a fragmentary vertical sectional view of the assembled socket assembly with an IC device shown in position in the assembly.

The socket assembly of the present invention provides a positive acting cam for moving the contacting portions of the contacts from a first rest position, to an open IC device receiving position, and then to pressure contacting electrical connection with the leads or contact points of an IC device placed in the socket assembly. The cam member affords positive engagement with the contacts and restricts displacement of the contacting portions thereof.

Referring now to FIGS. 1 through 4, there is illustrated a socket assembly for use with an IC device, which is top loading to facilitate automated loading and unloading of the socket to test and burn-in IC devices rapidly. The socket comprises a top plate or guide member 10 of generally rectangular shape, in this embodiment square to receive a plastic quad flat pack IC having leads along all four sides in close spaced relationship. The guide member has a tower 12 at the corners formed with inner surfaces to define a guide for the bumpers of the plastic quad flat pack device, which towers 12 are rigidly connected together by bars 14. The outer portions of the towers are formed with two perpendicularly oriented inwardly inclined cam surfaces 15 and 16.

A support frame 20, which is also generally square in plan view with truncated corners similar to that of the towers 12, cooperates with the guide member 10, supported there above, to support the IC. The support frame 20 is symmetrical and has four sides 25. Each side has a pawl 18 at each end of a lower shelf 22, a cradle 24 at each end for receiving and journaling one end of a cam member 30, and spacers 26 in the form of ribs for receiving and spacing the contact elements along the side. The inner portion of the sides 25 at the level of the lower shelf 22 is provided with openings 28 aligned with the spaces between the spacers 26 for receiving the anchoring portion of the contacts, to be described in detail later. An upper shelf 32 of each side 25 has guide posts 34 at the ends to form guides at the corners of the frame 20 for receiving and guiding the bumpers 41 at the corners of a plastic quad flat pack IC 40. Between the posts 34 and formed along an edge of the shelf 32 are spaced recesses between ribs 36, which recesses receive the leads 38 of the plastic quad flat pack IC 40, see FIG. 4, and the contacting portions of the contact elements.

During assembly of the socket, the cam members 30 are placed along each side 25 in the cradles 24. Each cam member 30 comprises a bar or shaft having oppositely projecting ends which fit beneath the free ends of the pawls 18 and spaced trunnions 44 and 45 which are received in the cradles 24. Radially projecting spaced crank arms 46 extend parallel from the shaft beyond the trunnions 44 and 45 and the ends thereof have surfaces 47 which engage the cam surfaces 15 and 16 of the guide member 10. The vertical movement of the guide member 10 toward and away from the frame 20 cause the arms 46 to rotate the shaft of the cam member about its longitudinal axis in the cradles 24. The shaft is also provided with a plurality of identical cam lobes 50 which extend radially of the shaft on the side of the shaft adjacent the side 25 and the lobes are separated by fins 52 which maintain the contacts in fixed spaced position while they are being flexed.

After the cam member 30 is in place the contacts are pressed into position. Of the plurality of contacts there are three different contact elements used in the embodiment illustrated in FIGS. 2 and 4. The difference in the contacts being the position of a terminal provided for making connection with an external electronic member, such as used for insertion into a plated hole of a printed circuit board. As illustrated the contacts 55, 56 and 57 are stamped from flat conductive sheet stock and are provided with connecting portions or terminals in the form of pin members 55a, 56a and 57a, respectively, positioned at different locations along a bar 55b, 56b and 57b of the contacts to engage spaced holes in an electronic member such as a printed circuit board. The contacts are positioned along the sides 25 in the desired pattern, usually in adjacent positions in repetitious patterns to fill the side with contacts, and are provided with anchoring members to hold the contacts securely to the sides 25. The anchoring members form the base of the contact and include the bars 55b, 56b and 57b, respectively, and an adjacent spaced bar 55c, 56c, and 57c respectively, which bars c are shorter than the bars b and are each provided with a barb 58. The barbs 58 engage a recess, or puncture the lower surface of the side wall 25 to hold the contact in place, see FIG. 4. The bars 56b and 56c, for example, then fit about a portion 59 of the side 25 to stabilize the base of the contact against rotation. Above the base, such as above the bar 56c, is a portion of each contact affording resilient movement of the contact distal end. The resilient portion is identified by the reference numeral 60. The resilient portion 60 is arcuate and surrounds the cam member 30 and terminates with a cam follower portion 62 and a contacting portion 64 which contacting portion engages the lead or contact point of the IC device. As illustrated in FIG. 4, the cam follower portion 62, is positioned to engage the cam lobe 50 and upon rotation of the cam member 30 in a clockwise direction as shown in FIG. 4, the contact will be flexed against the beam strength of the resilient portion 60 to move the contacting-portion 64 from the side 25 or from the lead 38 of the IC device to an open position to afford insertion or removal of the IC from the socket assembly. Upon removing the pressure forcing the guide member 10 toward the frame 20, the force of the contacts against the cam member, or members 30, cause the same to oscillate to a rest position and raises the guide member. The contacting portions 64 of the contacts are then free to seek their normal unflexed position. The spaced fins 52 direct the contacting portions accurately onto the leads or into the recesses for the leads between the ribs 36.

A second embodiment of a socket assembly constructed according to the present invention is illustrated in FIGS. 5, 7, 8 and 9.

The socket assembly of the second illustrated embodiment comprises a top plate or guide member 70 of generally rectangular shape, to receive a DIP type IC 75, as shown in FIG. 6. The IC device can have leads along two opposed sides in close spaced relationship, of the "J" type (as illustrated in broken lines), the pin type, gull-wing type or butt-end type. The guide member 70 has two sides 72 joined by ends 74. The guide member 70 is adapted to slidingly fit onto the socket assembly support frame 80. The corners of the guide member are formed with inner surfaces to guide the DIP device. The ends 74 are formed with two perpendicularly oriented depending legs 76 (only one of which is shown), which terminate at their upper edges in diverging outwardly inclined cam surfaces 77 and 78. The inner surface of the legs 76 are formed with shoulders which form stops against which pawls formed on the support frame 80 may engage, and together they afford means to hold the guide member 70 onto the support frame 80. The upper edge surface 79 of the sides 72 are formed to receive members on automatic loading equipment which force the guiding member vertically downward toward the frame 80.

The support frame 80 is also generally rectangular in plan view and is symmetrical about a perpendicular plane through the longitudinal axis. The frame 80 has two sides and ends, which ends are formed primarily by two pawls 82 mentioned above. Each side has two end pieces formed with cradles 84 for supporting a cam member 90 for oscillatory movement. The projecting end pieces are then connected by rods 85 positioned outwardly from the cradles 84. On the upper shelf or edges of the sides are a plurality of spaced recesses between ribs 86 formed integrally with the sides which serve to receive the leads of the IC device 75 and the contacting portions of the contacts, to be hereinafter described. At the ends of the upper shelf or edges of the sides, are guide posts 88, to form guides at the corners of the frame 80 for receiving and guiding the corners of a DIP IC 75, see FIG. 9. On the inner side of the sides, there is formed a shelf 89 with a plurality of small vertical slots 92 and 94, which are formed in rows, which slots receive the anchor means for the contacts.

Figure 9:
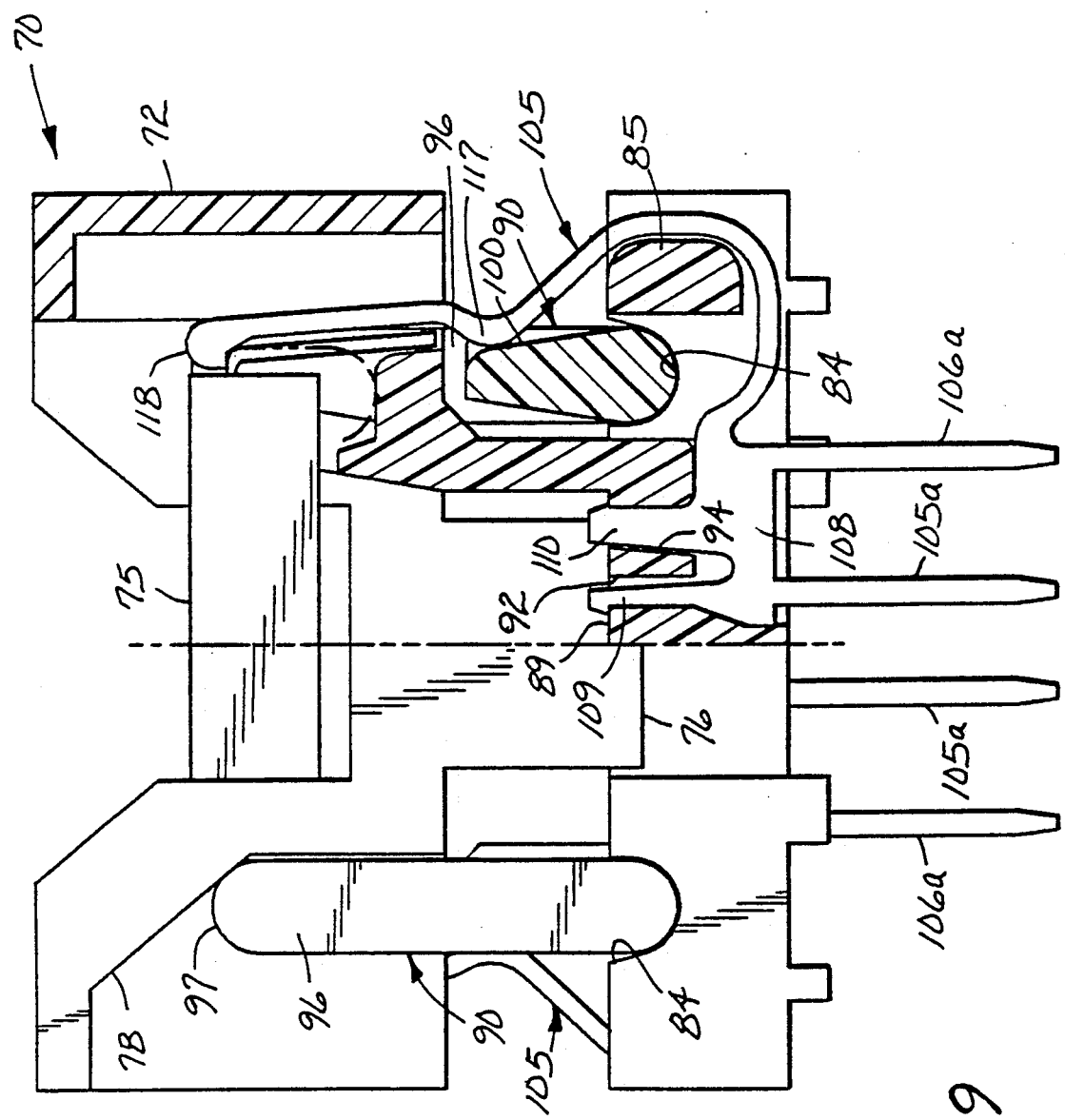
FIG. 9 is an end view of the second embodiment of the socket assembly of the present invention shown partly in section, along a vertical centerline, to show interior structure.

During assembly of the socket, the cam members 90 (the second of which is illustrated in FIG. 9) are placed in the cradles 84. The cam members 90 comprise a bar or shaft 95 having an arcuate edge forming trunnions and an axis of rotation for the cam member 90. The arcuate surfaces adjacent the ends of the bar are received in the cradles 84. Radially projecting crank arms 96 extend parallel from the ends of the bar 95 and have surfaces 97 which engage the cam surfaces 77 and 78 of the guide member 70. The vertical movement of the guide member 70 toward and away from the frame 80 cause the arms 96 to oscillate the bar 95 of the cam member about its longitudinal axis in the cradles 84. The shaft 95 is also provided with a plurality of identical cam lobes 100 which extend radially of the shaft on the side of the shaft 95 opposite the side near the frame. The lobes 100 are formed by recessing the shaft 95 with transverse slots along its length, which leaves fins 103 separating the cam lobes, which fins maintain the contacting portions of the contacts in fixed spaced position while they are being flexed.

After the cam members 90 are in place the contacts are pressed into position, from the under surface of the frame of this embodiment. Of the plurality of contacts there are two different contacts in the embodiment illustrated in FIGS. 8 and 9. The difference in the contacts being the position of a terminal provided for making connection with an external electronic member, such as used for insertion into a plated hole of a printed circuit board. As illustrated the contacts 105 and 106, are stamped from flat conductive sheet stock and are provided with terminals or connecting portions for connection to an external electronic member. The connecting portions are illustrated as pin members 105a and 106a respectively positioned at different locations along a base portion 108 of the contacts to engage spaced holes in the printed circuit board. The contacts are positioned along the sides of the frame 80 in the desired pattern, usually in adjacent alternating position to fill the side with contacts, and are provided with anchoring members to hold the contacts securely to the sides. The anchoring members project from the base 108 of the contact and include spaced upwardly projecting legs 109 and 110, each of which are provided with a barb 111. The barbs 111 engage the top surface of the shelf 89 on the inner side of the frame, after the legs have been inserted up through the slotted openings 92 and 94 formed in the shelf 89 to receive each pair of legs from the individual contacts 105 and 106. A surface of the slot 92 is mated with the edge of the contact, along the base and one leg of the anchor means to stabilize the base of the contact against rotation. Above base 108 of each contact is a portion affording resilient movement of the contact distal end, the resilient portion being identified by the reference numeral 115. The resilient portion 115 is arcuate and surrounds the shaft 85 and trunnion of the cam member 90 and terminates with a cam follower portion 117 and a contacting portion 118 which engages the lead of the IC device 75. As illustrated in FIG. 9, the cam follower portion 117, is positioned to engage the cam lobe 100 and upon rotation of the cam member 90, as shown on the right hand side of FIG. 9, in a clockwise direction the contacting portion 118 will be moved clockwise against the beam strength of the resilient portion 115 from the side or from the lead of the IC device to an open position to afford insertion or removal of the IC from the socket assembly. Upon removing the pressure forcing the guide member 70 toward the frame 80, the force of the contacts against the cam member, or members 90, rotates the cam member back toward the rest position and raises the guide member. The contacting portions 118 of the contacts are then free to seek their normal unflexed position or contact the IC lead or contact point. The spaced fins 86 direct the contacting portions accurately onto the leads or into the recesses for the leads between the ribs 86.

Having thus described the present invention, it will be appreciated that changes or modifications can be made in the disclosed and described embodiments without departing from the invention as recited in the appended claims.

I claim:

1. A socket assembly for use with an integrated circuit device having a plurality of contact points arranged along at least one side of the device, said assembly comprising:

a support frame having a generally rectangular configuration and spacer means along at least one side for receiving a plurality of contact elements, a plurality of generally planar contact elements disposed in spaced parallel relationship along said at least one side of said frame, each contact element comprising a connecting portion for making connection with an external electronic member, anchor means for anchoring each said contact element to said frame, contacting means for making resilient pressure contact with a said integrated circuit device, and means affording movement of said contacting means from a first normal unflexed position to an open position for receiving a said integrated circuit device and to an operative position in pressure electrical contact with a said integrated circuit device, cam means positioned along said at least one side of said frame and supported by said frame for engaging said contact elements to urge said contacting means thereof from said normal position to said open position, and a guide member supported for movement from a first position to a second position in relationship to said frame, said guide member having cam surface means on said guide member for cooperatively engaging said cam means for moving said contact elements to said open position upon movement of said guide member from said first position to said second position and to release said contact elements upon movement thereof back toward said first position in relationship to said frame.

2. A socket according to claim 1 wherein said cam means is provided with cam lobes for contacting said contact elements to urge the same from said normal position to said open position and with fin means for maintaining separation of said contact elements during engagement with said contact elements.

3. A socket according to claim 1 wherein said cam means are journalled on said frame by spaced cradles positioned along said one side and said cam means includes arm means for engaging said cam surface means on said guide member for affording oscillation of said cam means in said cradles to urge said contacting means to open position.

4. A socket according to claim 1 wherein said cam means comprises arm means for engaging said cam surface means which rock said cam means in a direction to move said contacting means of said contact elements from said first position.

5. A socket according to claim 4 wherein said cam means comprises a shaft having a longitudinal axis and cam lobes extending radially from said axis and positioned for engagement with said contact elements for urging said contacting means from said normal position to said open position.

6. A socket according to claim 1 wherein said means affording the movement of said contacting means of said contact elements comprises an arcuate portion which extends around said cam means and terminates with said contacting means.

7. A socket according to claim 6 wherein said contact element is formed of flat conductive sheet stock and said arcuate portion is connected to said anchor means and has a cam follower portion for engaging said cam means.

8. A socket according to claim 7 wherein said cam means is provided with cam lobes for contacting said cam follower portion of said contact elements to urge the contacting portions from said normal position to said open position and with fin means for maintaining separation of said contact elements during engagement of said cam means with said contact elements.

9. A socket according to claim 7 wherein said cam means are journalled on said frame by spaced cradles positioned along said one side and said cam means includes arm means for engaging said cam surface means on said guide member for affording oscillation of said cam means in said cradles to urge said contacting means to open position.

10. A socket according to claim 7 wherein said cam means comprises arm means for engaging said cam surface means which rock said cam means in a direction to engage said cam follower portion of said contact elements to urge said contacting portion from said first position.

11. A socket according to claim 10 wherein said cam means comprises a shaft having a longitudinal axis and cam lobes extending radially from said axis and positioned for engagement with said cam follower portions of said contact elements for urging said contacting means from said normal position to said open position.

12. A socket according to claim 1 wherein said frame and said guide member have four sides and cam means and contact elements are positioned on each of said four sides.

13. A socket according to claim 12 wherein said cam means comprises an oscillatable cam member positioned along each side of said frame and a plurality of contact elements positioned along each side, said cam means affording movement of the contacting portions of said plurality of contact elements upon movement of said guide member between said first and second positions in relationship to said frame, which movement is toward and away from said frame.

14. A socket according to claim 1 wherein said frame and said guide member have two longitudinal sides supporting said cam means and contact elements.

15. A socket according to claim 14 wherein said cam means comprises an oscillatable cam member positioned along each longitudinal side of said frame and a plurality of contact elements positioned along each longitudinal side, said cam means affording movement of the contacting portions of said plurality of contact elements upon movement of said guide member between said first and second positions in relationship to said frame, which movement is toward and away from said frame.

16. A socket assembly for use with an integrated circuit device having a plurality of leads arranged along two sides of the device, said assembly comprising:

a support frame having a generally rectangular configuration with two longitudinal sides and two ends and having spacer means along each longitudinal side for receiving a plurality of contact elements, a plurality of generally planar contact elements disposed in spaced parallel relationship along said longitudinal sides of said frame, each contact element comprising a connecting portion for making connection with an external electronic member, anchor means for anchoring each said contact element to said frame, contact means for making resilient pressure contact with a said integrated circuit device, and an arcuate resilient portion affording movement of said contacting means from a first normal unflexed position to an open position for receiving a said integrated circuit device and to an operative position in pressure electrical contact with a said integrated circuit device, cam means positioned along said longitudinal sides of said frame and surrounded by said arcuate resilient portions of said contact elements and supported by said frame for engaging said contact elements to urge said contacting means thereof from said normal position to said open position, and a guide member supported on said frame for movement from a first position to a second position in relationship to said frame, cam surface means on said guide member for cooperatively engaging said cam means for moving said contact elements to said open position upon movement of said guide member from said first position to said second position toward said frame and to release said contact elements upon movement thereof from said second position toward said first position in a direction away from said frame.

* * * * *

UNITED STATES PATENT AND TRADEMARK OFFICE
CERTIFICATE OF CORRECTION

PATENT NO.   : 4,993,955
DATED        : February 19, 1991
INVENTOR(S)  : John A. Savant It is certified that error appears in the above-indentified patent and that said Letters Patent is hereby corrected as shown below:

Column 9, Line 4, "contact" should read --contacting--.

Signed and Sealed this

Eighth Day of June, 1993

Attest:

MICHAEL K. KIRK

Attesting Officer            Acting Commissioner of Patents and Trademarks